United States Patent
Fei et al.

(10) Patent No.: US 12,081,233 B2
(45) Date of Patent: Sep. 3, 2024

(54) COMMON-MODE CURRENT REMOVAL SCHEME FOR DIGITAL-TO-ANALOG CONVERTERS

(71) Applicant: QUALCOMM Incorporated, San Diego, CA (US)

(72) Inventors: Haibo Fei, San Diego, CA (US); Xiahan Zhou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 154 days.

(21) Appl. No.: 17/810,100

(22) Filed: Jun. 30, 2022

(65) Prior Publication Data

US 2024/0007125 A1    Jan. 4, 2024

(51) Int. Cl.
*H03M 1/78* (2006.01)
*H03M 1/06* (2006.01)

(52) U.S. Cl.
CPC ......... *H03M 1/785* (2013.01); *H03M 1/0607* (2013.01)

(58) Field of Classification Search
CPC ...... H03M 1/785; H03M 1/0607; H03M 1/08; H03M 1/089; H03M 1/742
See application file for complete search history.

(56) References Cited

U.S. PATENT DOCUMENTS

| | | | | |
|---|---|---|---|---|
| 9,819,357 | B1 * | 11/2017 | Guo | H03M 1/0607 |
| 10,840,929 | B1 * | 11/2020 | Weil | H03M 1/1009 |
| 11,184,018 | B1 * | 11/2021 | Liu | H03K 5/1565 |
| 11,271,576 | B1 * | 3/2022 | Weil | H03M 1/1009 |
| 11,705,921 | B2 * | 7/2023 | Liu | H03M 1/74 455/127.1 |
| 2013/0342273 | A1 | 12/2013 | Petrie | |
| 2016/0336910 | A1 * | 11/2016 | Miri Lavasani | H03F 1/0205 |
| 2017/0033749 | A1 * | 2/2017 | Schmukler | H03F 3/21 |
| 2021/0391871 | A1 * | 12/2021 | Liu | G05F 3/262 |
| 2022/0352899 | A1 * | 11/2022 | Saputra | H03K 19/21 |
| 2022/0416804 | A1 * | 12/2022 | Mehdizad Taleie | H03M 1/002 |
| 2023/0336187 | A1 * | 10/2023 | Saputra | H03M 1/785 |
| 2023/0387929 | A1 * | 11/2023 | Sedighi | H03M 1/0854 |
| 2023/0403022 | A1 * | 12/2023 | Zhou | H03M 1/66 |
| 2023/0412130 | A1 * | 12/2023 | Cassia | H03F 3/195 |

FOREIGN PATENT DOCUMENTS

WO    2018208428 A1    11/2018

OTHER PUBLICATIONS

U.S. Appl. No. 17/359,918 as filed Jun. 28, 2021 (2101057).
International Search Report and Written Opinion—PCT/US2023/067454—ISA/EPO—Sep. 22, 2023.

* cited by examiner

*Primary Examiner* — Lam T Mai
(74) *Attorney, Agent, or Firm* — Patterson & Sheridan LLP (57) ABSTRACT

Methods and apparatus for common-mode current removal in a digital-to-analog converter (DAC). An example DAC circuit generally includes a plurality of current-steering cells, a resistor ladder circuit coupled to the plurality of current-steering cells, a first current sink coupled between a shunt branch of the resistor ladder circuit and a reference potential node for the DAC circuit, and a second current sink coupled between a first output of the DAC circuit and the reference potential node.

20 Claims, 7 Drawing Sheets

OPERATE A DIGITAL-TO-ANALOG CONVERTER (DAC) CIRCUIT COMPRISING A PLURALITY OF CURRENT-STEERING CELLS AND A RESISTOR LADDER CIRCUIT COUPLED TO THE PLURALITY OF CURRENT-STEERING CELLS

702

SINK A FIRST PORTION OF A COMMON-MODE CURRENT OF THE DAC CIRCUIT FROM A SHUNT BRANCH OF THE RESISTOR LADDER CIRCUIT

704

SINK A SECOND PORTION OF THE COMMON-MODE CURRENT OF THE DAC CIRCUIT FROM A FIRST OUTPUT OF THE DAC CIRCUIT

COMMON-MODE CURRENT REMOVAL SCHEME FOR DIGITAL-TO-ANALOG CONVERTERS

TECHNICAL FIELD

Certain aspects of the present disclosure generally relate to electronic circuits and, more particularly, to techniques and apparatus for common-mode current removal in a digital-to-analog converter (DAC).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a transmission digital-to-analog converter (TX DAC), which may be used, for example, to convert a digital signal to an analog signal for signal processing (e.g., filtering, upconverting, and amplifying) before transmission by one or more antennas.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include lower common-mode current variation with changes in process, voltage, and/or temperature (PVT), without impacting digital signal performance and without significantly increasing noise, offset, area, or power consumption of a digital-to-analog converter (DAC).

Certain aspects of the present disclosure provide a DAC. The DAC generally includes a plurality of current-steering cells, a resistor ladder circuit coupled to the plurality of current-steering cells, a first current sink coupled between a shunt branch of the resistor ladder circuit and a reference potential node for the DAC circuit, and a second current sink coupled between a first output of the DAC circuit and the reference potential node.

Certain aspects of the present disclosure provide a method of operating a DAC. The DAC generally includes a plurality of current-steering cells and a resistor ladder circuit coupled to the plurality of current-steering cells. The method generally involves sinking a first portion of a common-mode current of the DAC circuit from a shunt branch of the resistor ladder circuit and sinking a second portion of the common-mode current of the DAC circuit from a first output of the DAC circuit.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to techniques and apparatus for common-mode current removal in a digital-to-analog converter (DAC), such as a current-steering DAC with a resistor ladder circuit. The common-mode current removal scheme may be implemented with a first current sinking circuit coupled to a center of a shunt branch of the resistor ladder circuit and a second current sinking circuit coupled to an output (e.g., a differential output) of the DAC. The first and second current sinking circuits may be designed to remove (or at least substantially reduce) the common-mode current from the DAC. The second current sinking circuit may be designed to counteract variation due to process, voltage, and/or temperature (PVT) in the first current sinking circuit, such that the overall common-mode current removal scheme will be PVT independent, or at least have low variation.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
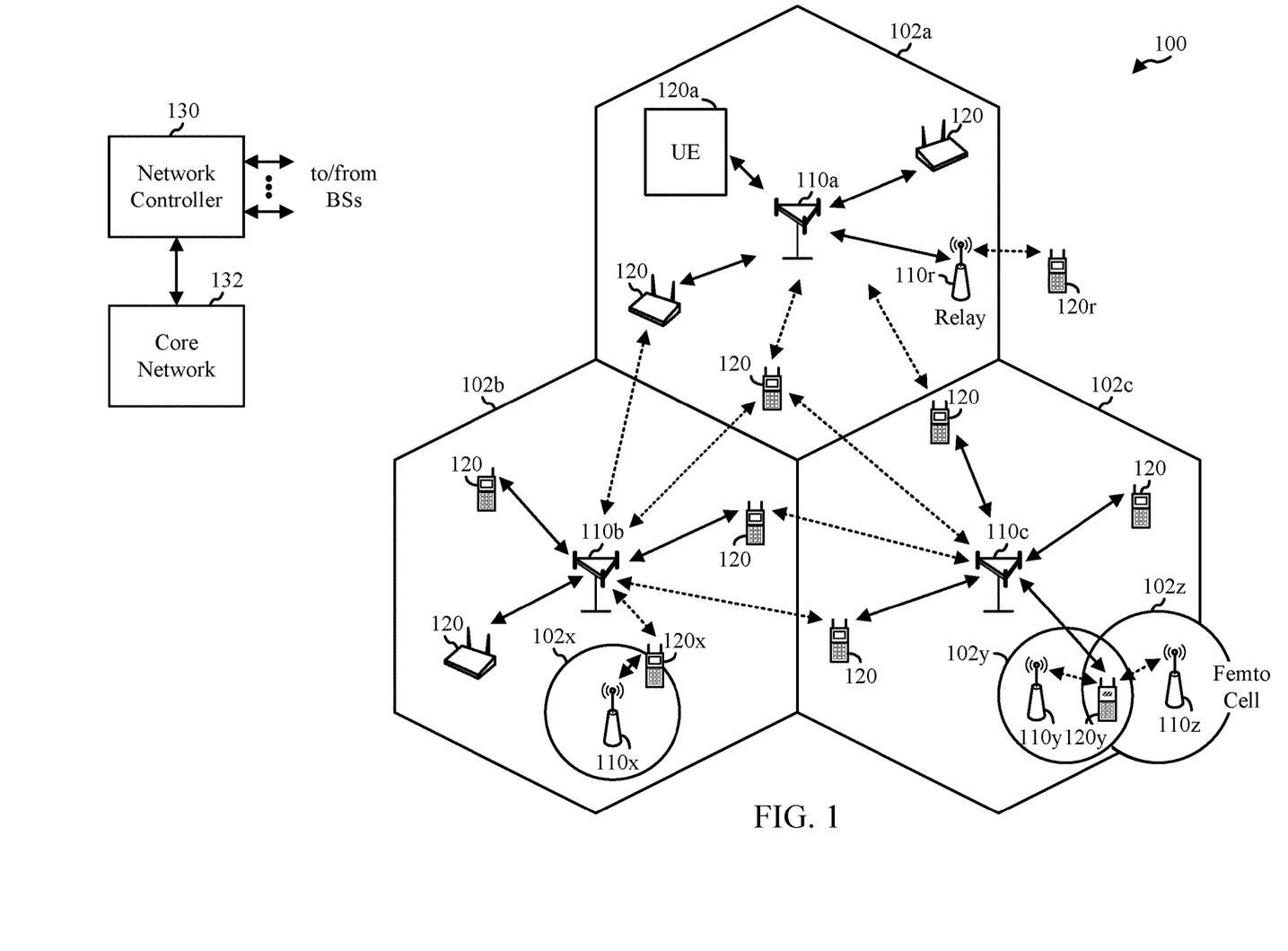
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS 110. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. ABS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a digital-to-analog converter (DAC) circuit implementing a common-mode current removal scheme, as described in more detail herein.

Figure 2:
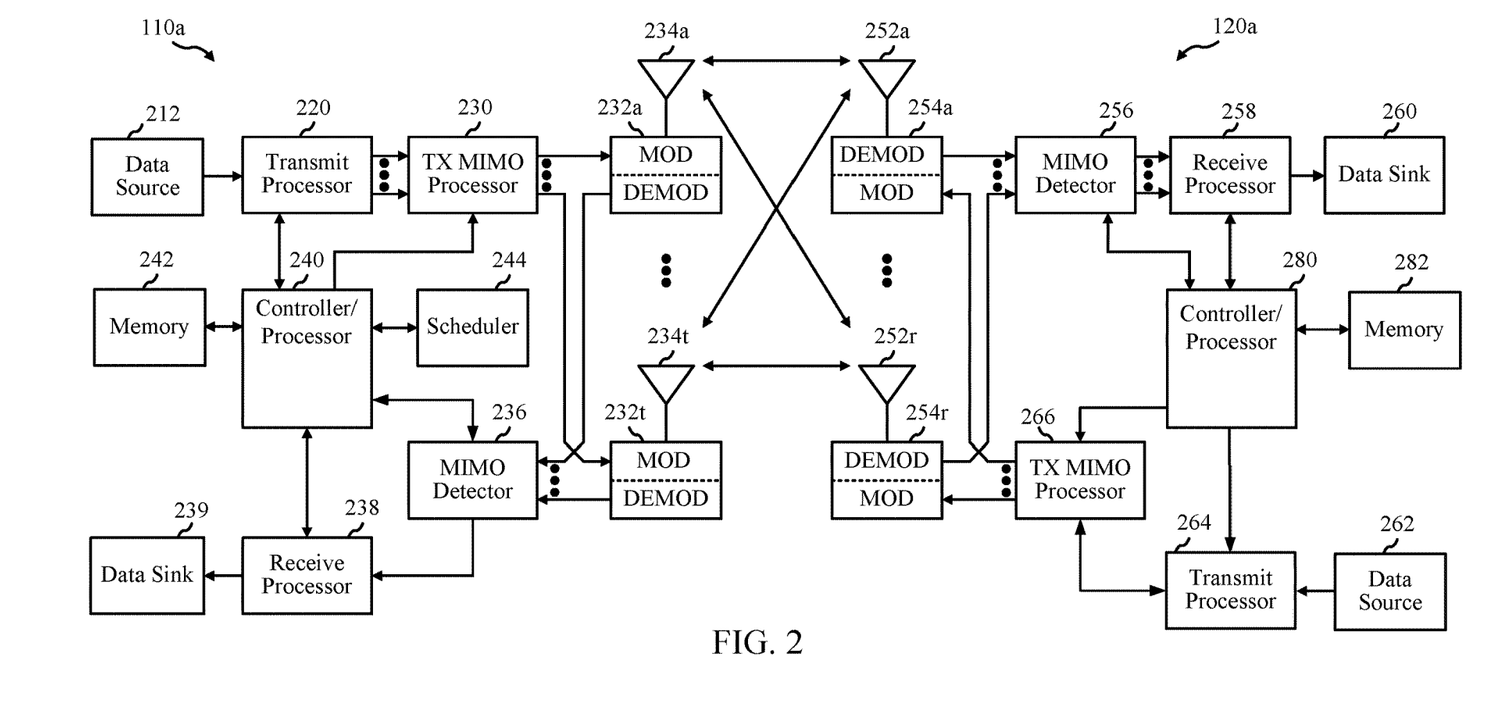
FIG. 2 is a block diagram conceptually illustrating a design of an example a base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARD) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120*a* and/or antennas 234, processors 220, 230, 238, and/or controller/processor 240 of the BS 110*a* may be used to perform the various techniques and methods described herein.

In certain aspects of the present disclosure, the transceivers 232 and/or the transceivers 254 may include a digital-to-analog converter (DAC) circuit implementing a common-mode current removal scheme, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
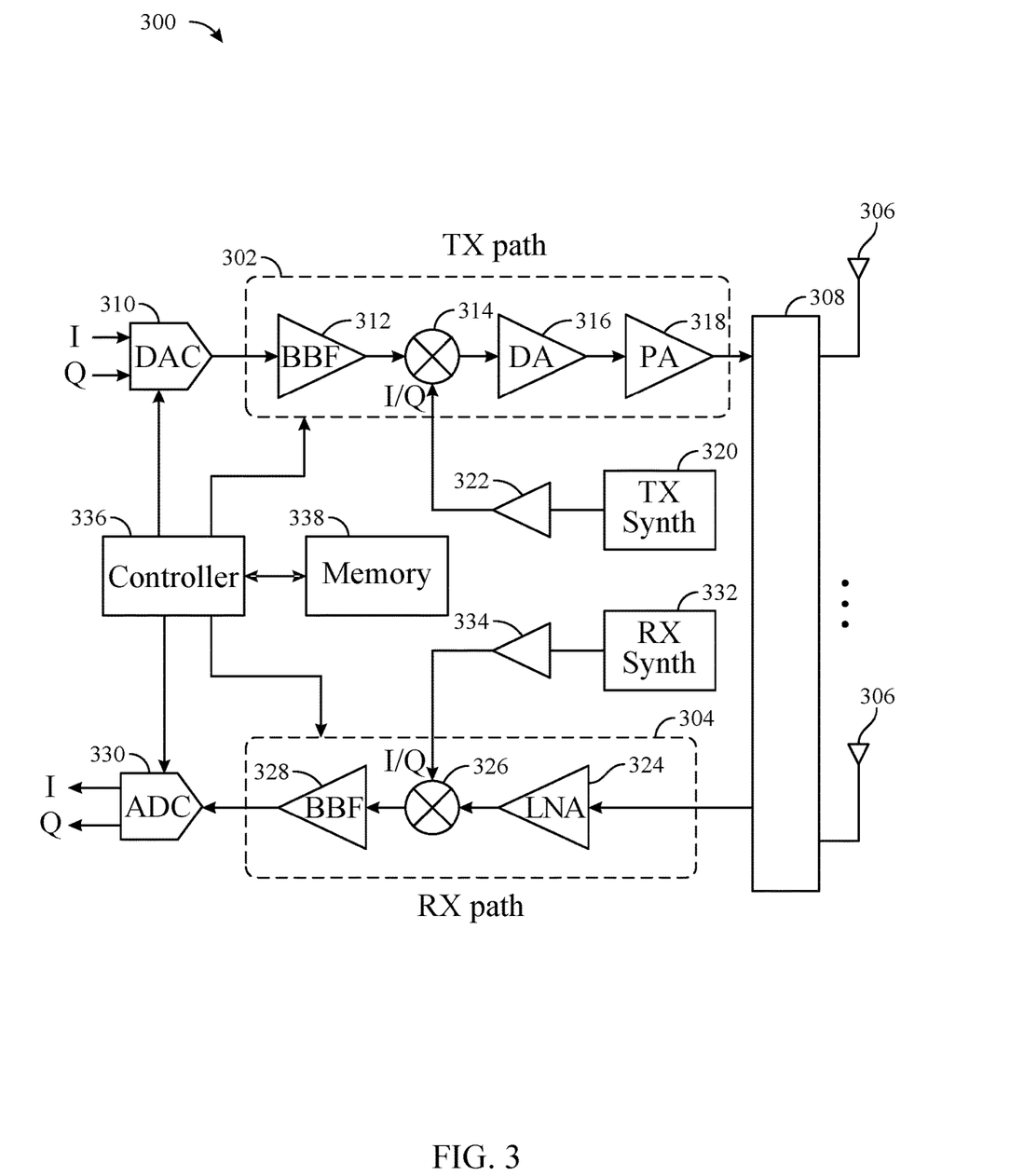
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

For certain aspects, the DAC 310 may be implemented by any of various suitable high-speed DAC topologies, such as a current-steering DAC. For certain aspects, the DAC 310 may be implemented with a common-mode current removal scheme for removing common-mode current from the DAC, as described in more detail below.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for digital-to-analog conversion in any of various other suitable systems (e.g., an audio system or other electronic system).

Introduction to Digital-to-Analog Conversion Using Current Steering

Current-steering digital-to-analog converters (DACs) are one example architecture for high performance digital-to-analog conversion in many wireless transmitters. Current-steering DACs offer versatility of design, high-speed operation, and high performance (such as relatively high linearity). Although current-steering DACs are described as one example type of DAC in which aspects of the present disclosure may be implemented, it is to be understood that aspects of the present disclosure may be applied to other suitable types of DACs, as well.

Figure 4:
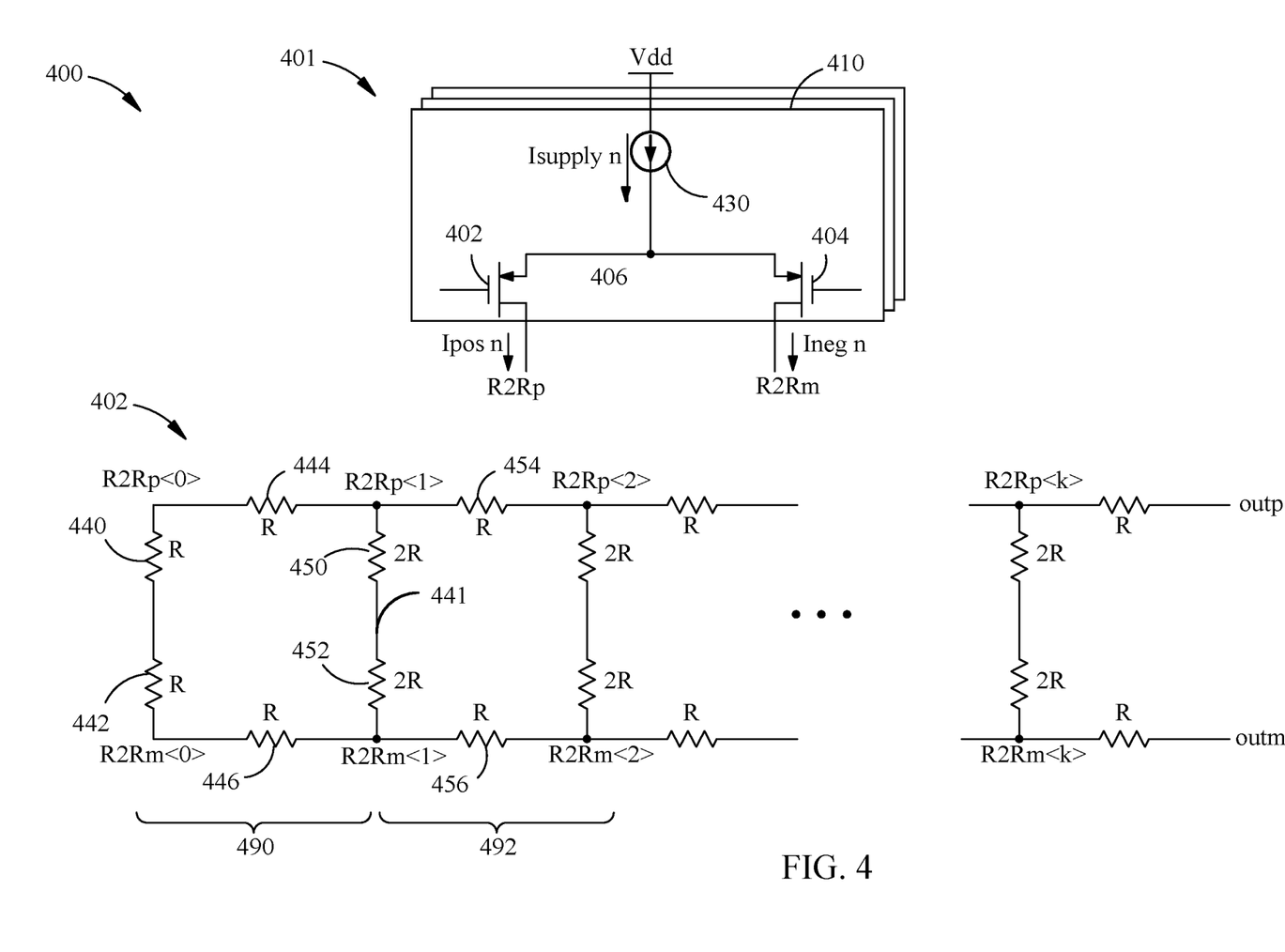
FIG. 4 illustrates an example digital-to-analog converter (DAC), in which aspects of the present disclosure may be practiced.

FIG. 4 illustrates an example current-steering DAC 400 (e.g., which may implement the DAC 310 of FIG. 3). As shown, the current-steering DAC 400 includes current-steering cells 401 and a resistor ladder circuit 402. The resistor ladder circuit 402 may be implemented as an R-2R type ladder circuit, as explained below. For example, the resistor ladder circuit 402 may include multiple segments (e.g., segments 490, 492), each of the segments including a positive ladder node R2Rp<0> to R2Rp<k> and a negative ladder node R2Rn<0> to R2Rn<k>. Between the positive ladder node and the negative ladder node of each segment may be resistive elements (e.g., resistive elements 440, 442, or resistive elements 450, 452). Moreover, a resistive element (e.g., resistive element 444 or 454) may be coupled between the positive nodes of adjacent segments of the resistor ladder circuit 402, and a resistive element (e.g., resistive element 446 or 456) may be coupled between the negative nodes of adjacent segments of the resistor ladder circuit 402. In an R-2R ladder circuit, the series resistive elements (e.g., resistive elements 444, 454) have a value of resistance, R and shunt resistive elements (e.g., resistive elements 450, 452 in a shunt branch 441 of the ladder circuit) have double this resistance (2R), in each half of the R-2R ladder circuit. For certain aspects, the least significant bits (LSBs) may follow the R-2R ladder structure, whereas the most significant bits (MSBs) may have different resistance values in the resistor ladder circuit (e.g., according to a thermometer code).

Each of the current-steering cells 401 (e.g., current-steering cell n, n being a positive integer) includes a current source coupled to a voltage rail Vdd, a positive switch coupled to the current source and configured to selectively provide a positive current (e.g., Ipos n) to a positive ladder node, and a negative switch coupled to the current source and configured to selectively provide a negative current (e.g., Ineg n) to a negative ladder node. For example, supply current Isupply 0 (e.g., Isupply n, where n is 0) through a current source 430 may be directed via a positive switch 403 of the current-steering cell 410 to provide a positive current (e.g., Ipos 0) to the positive ladder node R2Rp<0>. Similarly, Isupply 0 through the current source 430 may alternatively be directed via a negative switch 404 to provide a negative current (e.g., Ineg 0) to the negative ladder node R2Rn<0>. In a similar manner, currents from current sources of other current-steering cells may be directed via the positive or negative switch in each current-steering cell to respective positive and negative ladder nodes (R2Rp<1> to R2Rp<k>, and R2Rm<1> to R2Rm<k>).

The control inputs to the positive switch 403 and the negative switch 404 may be complementary. In some aspects, the switches 403 and 404 may be implemented as p-type metal-oxide-semiconductor (PMOS) transistors, as illustrated. Thus, a logic high signal may be used to open switch 403 or 404, and a logic low signal may be used to close switch 403 or 404.

The output signal from the DAC 400 is in the form of a differential current at positive and negative output nodes (labeled "outp" and "outm") of the resistor ladder circuit 402. To achieve high linearity, it is desirable to remove the common-mode current from the DAC 400 (or at least along the transmission path (e.g., TX path 302)). It may be desirable to minimize (or at least reduce) variation of the output common-mode current with changes in process, voltage, and/or temperature (PVT), while keeping noise and offset contributions from the common-mode current removal scheme to a minimum (or at least substantially low). Some previously known common-mode current removal techniques suffer from significant variation in the output common-mode current over changes in PVT and/or large differential noise and offset contributions from current sink circuitry.

Accordingly, aspects of the present disclosure provide a common-mode current removal scheme with reduced variation over PVT and lower noise and offset compared to some previously known techniques. The common-mode current removal scheme of the present disclosure is also power efficient, has a small lateral surface area (e.g., footprint), and has no significant impact on differential signal performance.

Figure 5:
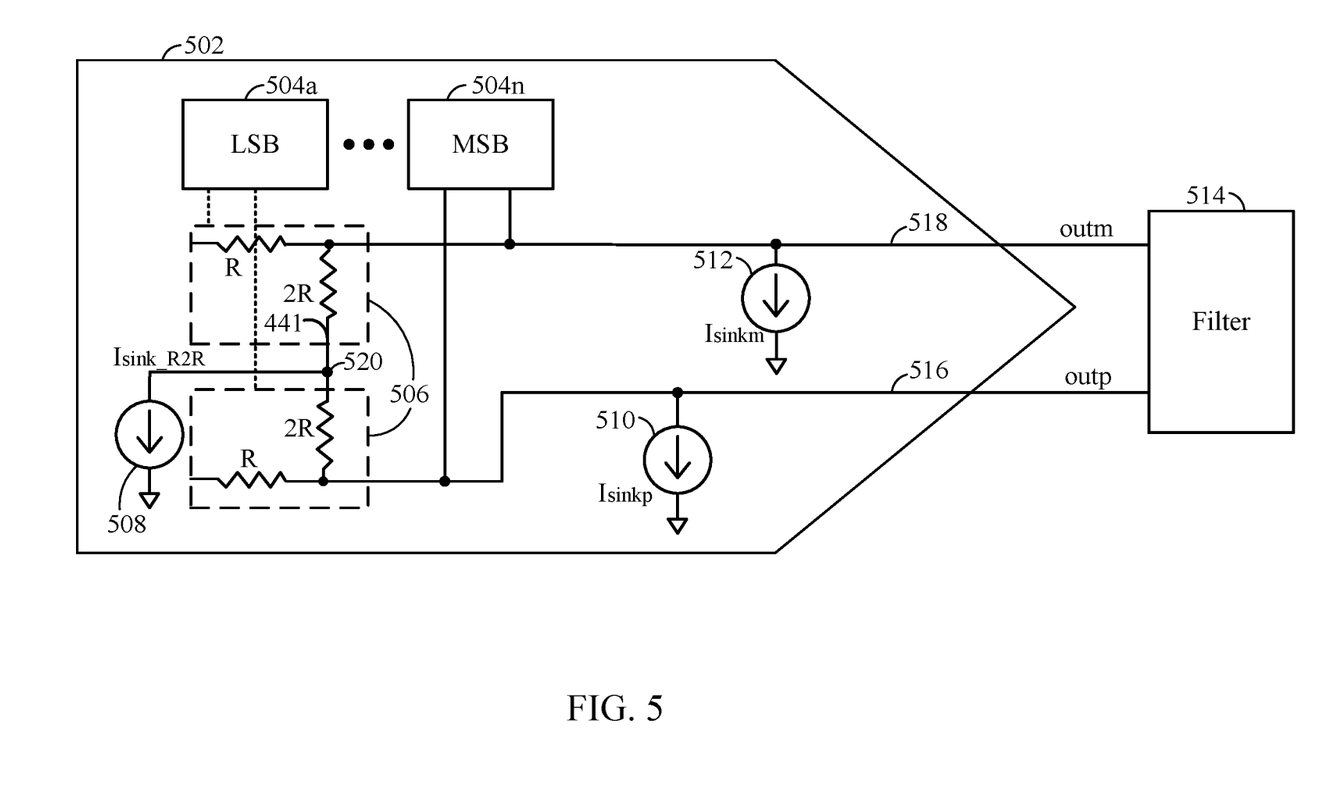
FIG. 5 is a block diagram of an example DAC circuit with common-mode current removal circuitry, in accordance with certain aspects of the present disclosure.

Example Digital-to-Analog Converter with a Multi-Approach Common-Mode Current Removal Scheme FIG. 5 illustrates an example digital-to-analog converter (DAC) circuit 502 with common-mode current removal circuitry, in accordance with certain aspects of the present disclosure. As shown, in some aspects, outputs (e.g., a positive output 516, labeled "outp," and a negative output 518, labeled "outm") of the DAC circuit 502 may be coupled to a filter 514 (e.g., a baseband filter, such as BBF 312). The positive output 516 and the negative output 518 compose a differential output (outp/outm) of the DAC circuit 502.

As illustrated, the DAC circuit 502 may generally include a plurality of current-steering cells 504a, . . . , 504n (collectively referred to as "current-steering cells 504") and a resistor ladder circuit 506 coupled to the plurality of current-steering cells 504. The current-steering cells 504 may be similar to the current-steering cells 401 of FIG. 4, and each current-steering cell may steer a current based on a single bit of a digital word, arranged from a most significant bit (MSB) to a least significant bit (LSB), as shown. Although only a single segment of the resistor ladder circuit 506 is shown in FIG. 5, the resistor ladder circuit 506 may be similar to the resistor ladder circuit 402 of FIG. 4 and may be implemented as an R-2R ladder circuit, for example, as described above.

The common-mode current removal circuitry of the DAC circuit 502 may include a first current sink 508 coupled between a shunt branch 441 of the resistor ladder circuit 506 and a reference potential node (e.g., electrical ground) for the DAC circuit 502. The first current sink 508 may sink a current referred to as "$I_{sink\_R2R}$." For certain aspects, the first current sink 508 may be implemented as a short between the shunt branch 441 and the reference potential node. Such a short may be used to sink as much common-mode current as possible from the resistor ladder circuit. In certain aspects, the first current sink 508 may be coupled between a center of the shunt branch 441 in a segment of the resistor ladder circuit 506 and the reference potential node. In certain aspects, the first current sink 508 may be coupled between the reference potential node and a node 520 between two shunt resistive elements (e.g., resistive elements 450, 452) in the shunt branch 441 of the resistor ladder circuit 506.

The common-mode current removal circuitry may also include a second current sink 510, which may be coupled between the positive output 516 of the DAC circuit 502 and the reference potential node. For certain aspects, the common-mode current removal circuitry may further include a third current sink 512 coupled between the negative output 518 of the DAC circuit 502 and the reference potential node for the DAC circuit 502. The second current sink 510 may sink a current referred to as "$I_{sinkp}$" from the positive output 516, and the third current sink 512 may sink a current referred to as "$I_{sinkm}$" from the negative output 518. Thus, the second current sink 510 and the third current sink 512 may be part of the same current removal scheme, with a pair of current sinks coupled to the differential output (outp/outm).

In this manner, the first current sink 508 may be configured to sink a first portion (e.g., $I_{sink\_R2R}$) of the common-mode current of the DAC circuit 502, and the second current sink 510 may be configured to sink a second portion (e.g., $I_{sinkp}$) of the common-mode current of the DAC circuit 502. In other words, the first current sink 508 may be designed to sink as much common-mode current as possible, and the second current sink 510 (together with the third current sink 512) may be designed to remove the rest of the common-mode current from the DAC circuit 502.

Furthermore, the first current sink 508 may be configured such that the first portion of the common-mode current decreases with an increase in a resistance of the resistor ladder circuit 506. In contrast, the second current sink 510 may be configured such that the second portion of the common-mode current increases with the increase in the resistance of the resistor ladder circuit 506. In this manner, the second portion of the common-mode current may counteract at least a portion (e.g., most) of a variation in the first portion of the common-mode current, this variation being due to at least one of a process, voltage, or temperature variation in the DAC circuit 502.

In an example, if the resistance of the resistor ladder circuit 506 increases due to a change in at least one of process, voltage, or temperature, less common-mode current may be sunk using the first current sink 508 (i.e., $I_{sink\_R2R}$ decreases). Accordingly, the second current sink 510 (and, in some cases, the third current sink 512) may sink a greater amount of common-mode current so that the total amount of common-mode current ($I_{sink\_tot}$) removed from the DAC circuit 502 generally remains constant.

Figure 6:
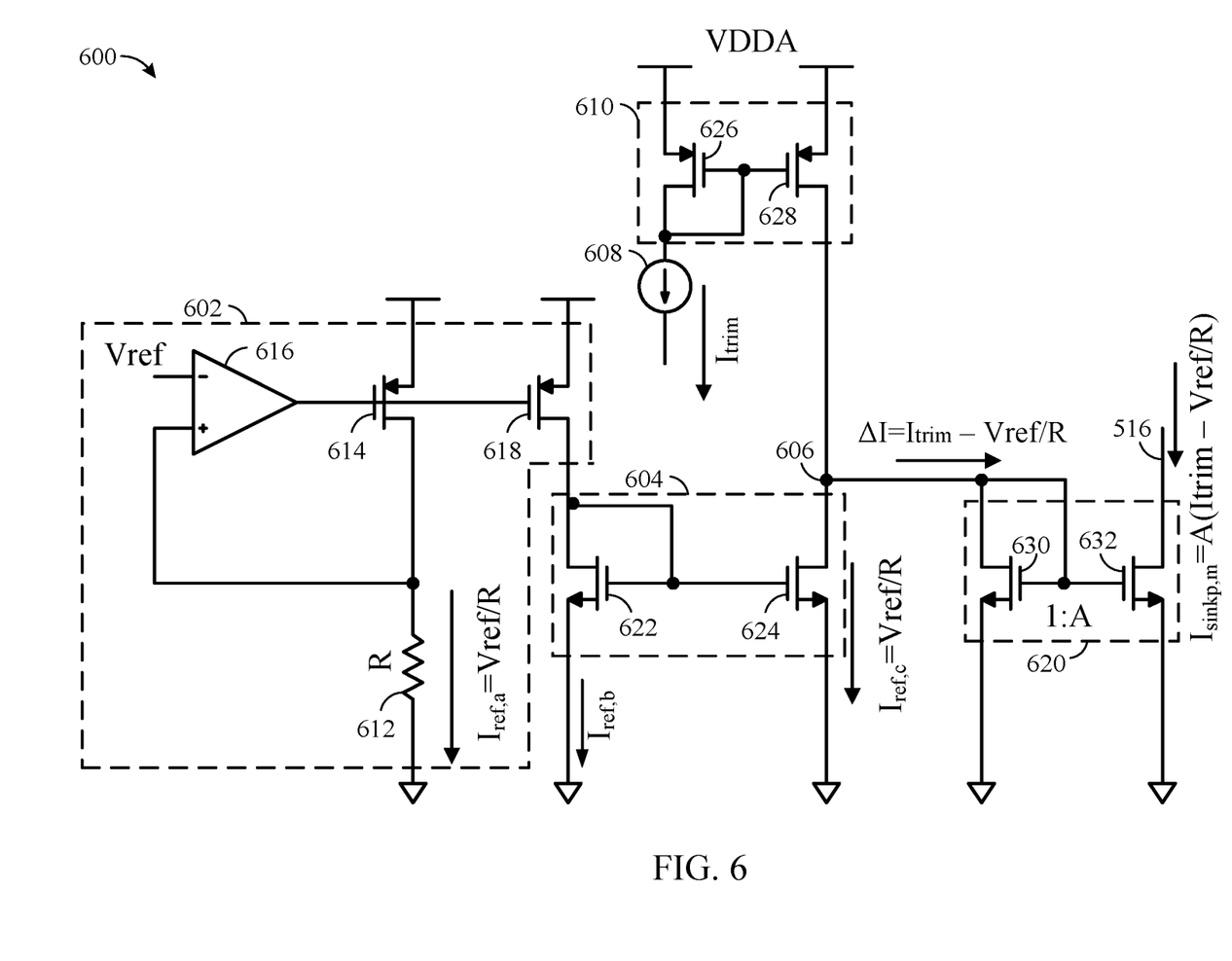
FIG. 6 is a schematic diagram of an example implementation of one or more current sinks in the common-mode current removal scheme of FIG. 5, in accordance with certain aspects of the present disclosure.

FIG. 6 is a schematic diagram 600 illustrating an example implementation of the second current sink 510 (and/or the third current sink 512) in the common-mode current removal scheme of FIG. 5, in accordance with certain aspects of the present disclosure. As shown, the second current sink 510 (and/or the third current sink 512) may generally include a first current source 602, a first current mirror 604, a second current source 608, a second current mirror 610, and a third current mirror 620. For ease of explanation, the second current sink 510 is generally described hereinafter, but the reader is to understand that the third current sink 512 may be added by simply adding a third branch to the third current mirror 620.

The first current source 602 may be implemented with any of various suitable current source circuits. In the example of FIG. 6, the first current source 602 may include a reference resistive element 612, a first transistor 614, an amplifier 616, and a second transistor 618. As shown, the reference resistive element 612 may have a resistance R and may be coupled between the drain of the first transistor 614 and a reference potential node (e.g., electrical ground) for the second current sink 510. The reference resistive element 612 may be the same resistor type as a plurality of resistive elements (e.g., resistive elements 444, 454) in the resistor ladder circuit 402 or 506. The amplifier 616 may have a first input coupled to a reference voltage source (producing a reference voltage labeled "Vref"), have a second input coupled to the drain of the first transistor 614, and have an output coupled to the gate of the first transistor 614. The reference voltage source may be implemented by any suitable stable reference voltage source, such as bandgap reference. The gate of the second transistor 618 may be coupled to the output of the amplifier 616, and the drain of the second transistor 618 may serve as the output of the first current source 602. The sources of the first transistor 614 and the second transistor 618 may be coupled to a voltage rail Vdda.

During operation, the amplifier 616 drives the first transistor 614 to maintain the reference voltage Vref across the reference resistive element 612, thereby regulating a reference current $I_{ref,a}$ through the first transistor 614 and the reference resistive element 612. If the second transistor 618 is a replica of the first transistor 614, the amplifier 616 drives the second transistor 618 with the same output voltage to generate a similar reference current $I_{ref,b}$ through the second transistor 618 ($I_{ref,b} \approx I_{ref,a}$).

The first current mirror 604 may have a first branch (e.g., comprising a transistor 622) coupled to the first current source 602 (e.g., to the drain of the second transistor 618) and have a second branch (e.g., comprising a transistor 624) coupled to a common node 606. The transistor 624 in the second branch of the first current mirror 604 may be a replica of the transistor 622 in the first branch. In this case, during operation, the second branch of the first current mirror 604 may replicate the reference current $I_{ref,b}$ flowing in the first branch from the first current source 602 to provide a mirrored reference current $I_{ref,c}$ ($\approx I_{ref,b} \approx I_{ref,a}$).

The second current source 608 may provide another reference current $I_{trim}$, which may most likely have been calibrated and may thus be independent of process, voltage, and temperature (PVT) variation. The second current mirror 610 may have a first branch (e.g., comprising a transistor 626) coupled to the second current source 608 and having a second branch (e.g., comprising a transistor 628) coupled to the common node 606. The transistor 628 in the second branch of the second current mirror 610 may be a replica of the transistor 626 in the first branch. In this case, during operation, the second branch of the second current mirror 610 may replicate the reference current $I_{trim}$ sunk by the second current source 608 through the first branch to provide a mirrored reference current (equal to $I_{trim}$).

The third current mirror 620 may have a first branch (e.g., comprising a transistor 630) coupled to the common node 606 and have a second branch (e.g., comprising a transistor 632) coupled to the positive output 516 of the DAC circuit 502 (or the negative output 518 in the case of the third current sink 512). According to certain aspects, the third current mirror 620 may have a gain "A" from the first branch of the third current mirror 620 to the second branch of the third current mirror 620 (e.g., illustrated by the ratio 1:A). During operation, the first branch of the third current mirror 620 receives a difference current ΔI representing the difference between the reference currents $I_{trim}$ and $I_{ref,c}$ (ΔI=$I_{trim}$−$I_{ref,c} \approx I_{trim}$−$V_{ref}$/R). The second branch of the third current mirror 620 may amplify the difference current ΔI flowing in the first branch from the common node 606 to provide a sinking current ($I_{sinkp,m} \approx A(I_{trim}-V_{ref}/R)$).

The second current sink 510 (and, in some cases, the third current sink 512) may be designed to track the first current sink 508 across variations in PVT. As described above, the amount of current sunk by the second current sink 510 (or the third current sink 512) may be calculated as $$I_{sinkp,m} = A_{mirror} * \left(I_{trim} - \frac{V_{ref}}{R}\right)$$

where $A_{mirror}$ is the mirror gain of the third current mirror 620, $I_{trim}$ is the current generated by the second current source 608, $V_{ref}$ is the reference voltage at the first input of the amplifier 616, and R is the resistance of the reference resistive element 612.

Moreover, the total current sunk by the multiple current sinks in this hybrid common-mode current-removal scheme may be calculated as $$I_{sink,tot} = I_{sink,R2R} + I_{sinkp,m} = \frac{V_{cm}}{R_{R2R,eq}} + A_{mirror} * I_{trim} - \frac{A_{mirror} * V_{ref}}{R}$$

where $I_{sink,R2R}$ is the current sunk by the first current sink 508, $V_{cm}$ is the common-mode voltage, and $R_{R2R,eq}$ is the equivalent resistance of the resistor ladder circuit 506. If one wishes to consider only variations to the terms in the above equation, $I_{trim}$ is PVT-independent, so the variation in the middle term ($\Delta(A_{mirror}*I_{trim})$) will be effectively zero. Accordingly, an equation for the variations to the terms may be written as follows:

$$\Delta I_{sink,tot} = \Delta \frac{V_{cm}}{R_{R2R,eq}} - \Delta \frac{A_{mirror}*V_{ref}}{R}$$

As a result, PVT variations in the first current sink 508 will be canceled out (e.g., counteracted using the second current sink 510 and the third current sink 512) such that $\Delta I_{sink,tot}=0$ if the following equation is true:

$$\frac{R}{R_{R2R,eq}} = \frac{A_{mirror}*V_{ref}}{V_{cm}}$$

In an example, the total amount of common-mode current to be sunk may be 500 μA. In this case, if $V_{cm}$ equals 500 mV and $R_{R2R,eq}$ equals 1.33 kΩ, then $I_{sink,R2R}$ equals 376 μA (=500 mV/1.33 kΩ). Accordingly, the amount of current that the second current sink 510 (and/or the third current sink 512) should sink (e.g., $I_{sinkp,m}$) is equal to 124 μA (=500 μA−376 μA) to sink the remaining common-mode current that was not sunk by the first current sink 508. So, if $I_{trim}$ is set to 50 μA, $V_{ref}$ equals 1.25 V, the resistance value R of the reference resistive element 612 is set to 33.24 kΩ, and $A_{mirror}$ is set to 10, the equation above will be satisfied.

Aspects of the present disclosure with the common-mode removal scheme presented herein offer reduced noise, offset, and variation over PVT compared to some other common-mode current removal techniques. In some cases, the scheme presented herein may have up to ten times less variation across PVT, up to 20% less offset, and up to 25% less noise compared to previously known techniques.

Example Conversion Operations

Figure 7:
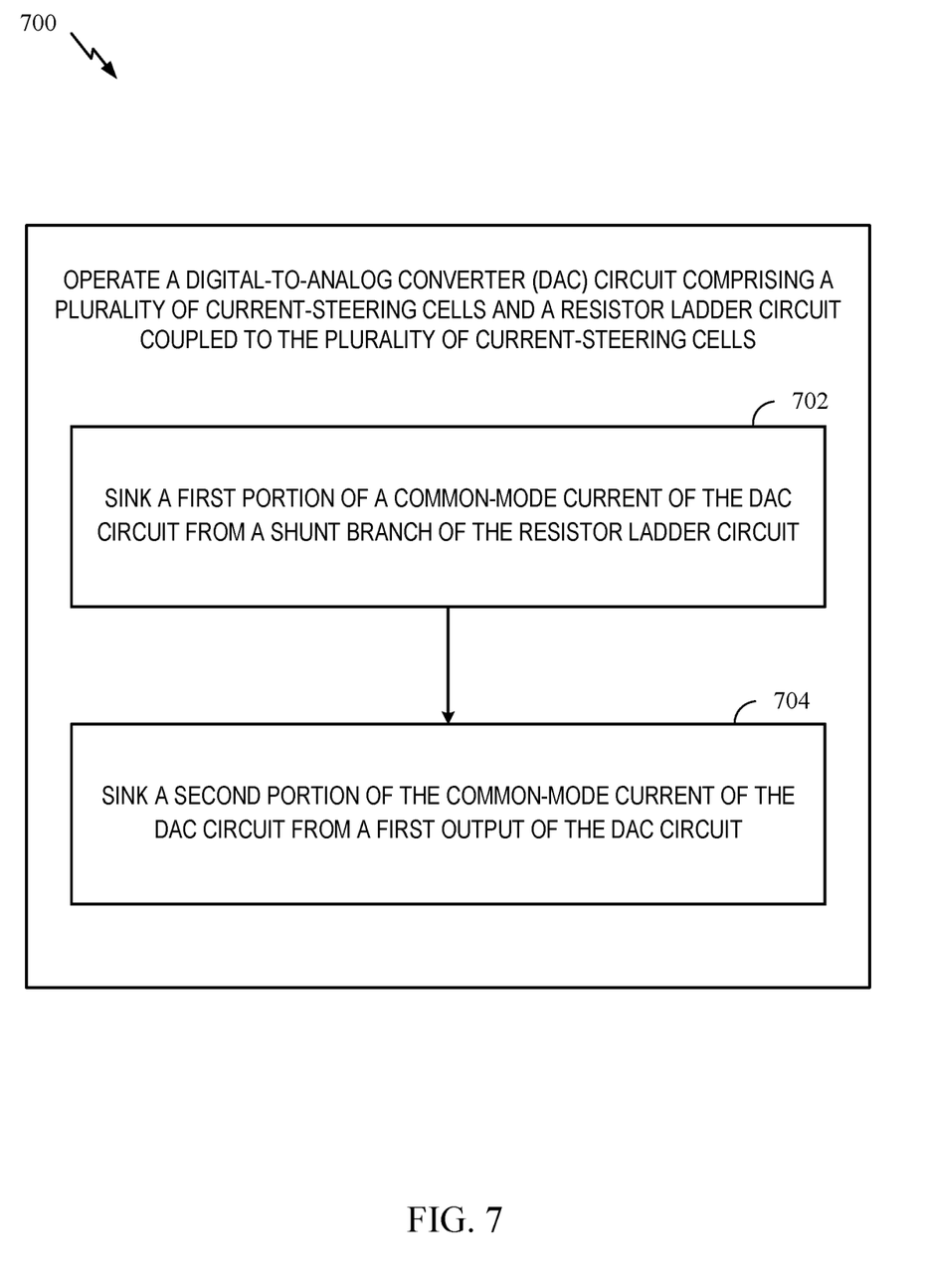
FIG. 7 is a flow diagram of example operations for digital-to-analog conversion with common-mode current removal, in accordance with certain aspects of the present disclosure.

FIG. 7 is a flow diagram of example operations 700 for digital-to-analog conversion with common-mode current removal in a DAC circuit (e.g., the DAC circuit 502), in accordance with certain aspects of the present disclosure. The DAC circuit generally includes a plurality of current-steering cells (e.g., the current-steering cells 504), and a resistor ladder circuit (e.g., the resistor ladder circuit 506) coupled to the plurality of current-steering cells.

The operations 700 may generally involve, at block 702, sinking a first portion (e.g., $I_{sink\_R2R}$) of a common-mode current of the DAC circuit from a shunt branch (e.g., shunt branch 441) of the resistor ladder circuit. The operations 700 may also involve, at block 704, sinking a second portion (e.g., $I_{sinkp}$) of the common-mode current of the DAC circuit from a first output (e.g., the positive output 516) of the DAC circuit.

According to certain aspects, the first portion of the common-mode current may decrease with an increase in a resistance of the resistor ladder circuit, and the second portion of the common-mode current may increase with the increase in the resistance of the resistor ladder circuit. For certain aspects, the first portion of the common-mode current may increase with a decrease in the resistance of the resistor ladder circuit, and the second portion of the common-mode current may decrease with the decrease in the resistance of the resistor ladder circuit. The second portion of the common-mode current may counteract at least a portion of a variation in the first portion of the common-mode current, due to at least one of a process, voltage, or temperature variation in the DAC circuit.

According to certain aspects, the operations 700 may involve sinking a third portion (e.g., $I_{sinkm}$) of the common-mode current of the DAC circuit from a second output (e.g., the negative output 518) of the DAC circuit. In this case, the first output and the second output may compose a differential output of the DAC circuit.

According to certain aspects, sinking the second portion of the common-mode current at block 704 may involve generating a first reference current (e.g., $I_{ref,a}$, which may be generated using the first current source 602); generating a second reference current (e.g., $I_{ref,b}$) in a first branch of a first current mirror (e.g., the first current mirror 604) based on the generating of the first reference current; mirroring the second reference current in a second branch of the first current mirror (to generate $I_{ref,c}$); generating a third reference current (e.g., $I_{trim}$) in a first branch of a second current mirror (e.g., the second current mirror 610); mirroring the third reference current in a second branch of the second current mirror; providing a difference current (e.g., different current ΔI), as a difference between the mirrored third reference current and the mirrored second reference current, to a first branch of a third current mirror (e.g., the third current mirror 620); and mirroring the difference current in a second branch of the third current mirror, wherein the second portion of the common-mode current comprises the mirrored difference current.

In certain aspects, mirroring the difference current involves mirroring the difference current with a gain (e.g., $A_{mirror}$) from the first branch of the third current mirror to the second branch of the third current mirror. For certain aspects, the third reference current is calibrated and is independent of process, voltage, and temperature variation.

Example Aspects

In addition to the various aspects described above, specific combinations of aspects are within the scope of the present disclosure, some of which are detailed below:

Aspect 1: A digital-to-analog converter (DAC) circuit comprising: a plurality of current-steering cells; a resistor ladder circuit coupled to the plurality of current-steering cells; a first current sink coupled between a shunt branch of the resistor ladder circuit and a reference potential node for the DAC circuit; and a second current sink coupled between a first output of the DAC circuit and the reference potential node.

Aspect 2: The DAC circuit of Aspect 1, wherein the first current sink is configured to sink a first portion of a common-mode current of the DAC circuit and wherein the second current sink is configured to sink a second portion of the common-mode current of the DAC circuit.

Aspect 3: The DAC circuit of Aspect 2, wherein the first current sink is configured such that the first portion of the common-mode current decreases with an increase in a resistance of the resistor ladder circuit and wherein the second current sink is configured such that the second portion of the common-mode current increases with the increase in the resistance of the resistor ladder circuit.

Aspect 4: The DAC circuit of Aspect 2 or 3, wherein the second current sink is configured such that the second portion of the common-mode current counteracts at least a portion of a variation in the first portion of the common-mode current, due to at least one of a process, voltage, or temperature variation in the DAC circuit.

Aspect 5: The DAC circuit of any of the preceding Aspects, further comprising a third current sink coupled between a second output of the DAC circuit and the reference potential node for the DAC circuit, wherein the first output and the second output compose a differential output of the DAC circuit.

Aspect 6: The DAC circuit of any of the preceding Aspects, wherein the first current sink is coupled between a center of the shunt branch in a segment of the resistor ladder circuit and the reference potential node for the DAC circuit.

Aspect 7: The DAC circuit of any of the preceding Aspects, wherein the first current sink is coupled between the reference potential node and a node between two shunt resistive elements in the shunt branch of the resistor ladder circuit.

Aspect 8: The DAC circuit of any of the preceding Aspects, wherein the second current sink comprises: a first current source; a first current mirror having a first branch coupled to the first current source and having a second branch coupled to a common node; a second current source; a second current mirror having a first branch coupled to the second current source and having a second branch coupled to the common node; and a third current mirror having a first branch coupled to the common node and having a second branch coupled to the first output of the DAC circuit.

Aspect 9: The DAC circuit of Aspect 8, wherein the third current mirror has a gain from the first branch of the third current mirror to the second branch of the third current mirror.

Aspect 10: The DAC circuit of Aspect 8 or 9, wherein the first current source comprises: a reference resistive element; a first transistor; an amplifier having a first input coupled to a reference voltage source, having a second input coupled to a drain of the first transistor, and having an output coupled to a gate of the first transistor; and a second transistor having a gate coupled to the output of the amplifier and having a drain coupled the first branch of the first current mirror.

Aspect 11: The DAC circuit of Aspect 10, wherein the reference resistive element is a same resistor type as a plurality of resistive elements in the resistor ladder circuit.

Aspect 12: The DAC circuit of any of Aspects 8-11, wherein the second current source is calibrated and is independent of process, voltage, and temperature variation.

Aspect 13: The DAC circuit of any of the preceding Aspects, wherein the first current sink is a short between the shunt branch of the resistor ladder circuit and the reference potential node for the DAC circuit.

Aspect 14: A method of operating a digital-to-analog converter (DAC) circuit comprising a plurality of current-steering cells and a resistor ladder circuit coupled to the plurality of current-steering cells, the method comprising: sinking a first portion of a common-mode current of the DAC circuit from a shunt branch of the resistor ladder circuit; and sinking a second portion of the common-mode current of the DAC circuit from a first output of the DAC circuit.

Aspect 15: The method of Aspect 14, wherein the first portion of the common-mode current decreases with an increase in a resistance of the resistor ladder circuit and wherein the second portion of the common-mode current increases with the increase in the resistance of the resistor ladder circuit.

Aspect 16: The method of Aspect 14 or 15, wherein the second portion of the common-mode current counteracts at least a portion of a variation in the first portion of the common-mode current, due to at least one of a process, voltage, or temperature variation in the DAC circuit.

Aspect 17: The method of any of Aspects 14-16, further comprising sinking a third portion of the common-mode current of the DAC circuit from a second output of the DAC circuit, wherein the first output and the second output compose a differential output of the DAC circuit.

Aspect 18: The method of any of Aspects 14-17, wherein sinking the second portion of the common-mode current comprises: generating a first reference current; generating a second reference current in a first branch of a first current mirror based on the generating of the first reference current; mirroring the second reference current in a second branch of the first current mirror; generating a third reference current in a first branch of a second current mirror; mirroring the third reference current in a second branch of the second current mirror; providing a difference current, as a difference between the mirrored third reference current and the mirrored second reference current, to a first branch of a third current mirror; and mirroring the difference current in a second branch of the third current mirror, wherein the second portion of the common-mode current comprises the mirrored difference current.

Aspect 19: The method of Aspect 18, wherein mirroring the difference current comprises mirroring the difference current with a gain from the first branch of the third current mirror to the second branch of the third current mirror.

Aspect 20: The method of Aspect 18 or 19, wherein the third reference current is calibrated and is independent of process, voltage, and temperature variation.

CONCLUSION

Described herein is a digital-to-analog converter (DAC) circuit to remove common-mode current with reduced variation across process, voltage, and/or temperature (PVT) changes. Certain aspects of the present disclosure provide a multi-approach common-mode current removal scheme that can track changes in PVT. In certain aspects, a first current sink may be configured to sink a first portion of the common-mode current, and a second current sink may be configured to sink a second portion of the common-mode current. The second portion of the common-mode current may counteract, or at least reduce, variation in the first portion of the common-mode current due to at least one of process, voltage, or temperature.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A digital-to-analog converter (DAC) circuit comprising:
   a plurality of current-steering cells;
   a resistor ladder circuit coupled to the plurality of current-steering cells;
   a first current sink coupled between a shunt branch of the resistor ladder circuit and a reference potential node for the DAC circuit, wherein the first current sink is configured to sink a first portion of a common-mode current of the DAC circuit; and
   a second current sink coupled between a first output of the DAC circuit and the reference potential node, wherein the second current sink is configured to sink a second portion of the common-mode current of the DAC circuit.

2. The DAC circuit of claim 1, wherein the first current sink is configured such that the first portion of the common-mode current decreases with an increase in a resistance of the resistor ladder circuit and wherein the second current sink is configured such that the second portion of the common-mode current increases with the increase in the resistance of the resistor ladder circuit.

3. The DAC circuit of claim 1, wherein the second current sink is configured such that the second portion of the common-mode current counteracts at least a portion of a variation in the first portion of the common-mode current, due to at least one of a process, voltage, or temperature variation in the DAC circuit.

4. The DAC circuit of claim 1, further comprising a third current sink coupled between a second output of the DAC circuit and the reference potential node for the DAC circuit, wherein the first output and the second output compose a differential output of the DAC circuit.

5. The DAC circuit of claim 1, wherein the first current sink is coupled between a center of the shunt branch in a segment of the resistor ladder circuit and the reference potential node for the DAC circuit.

6. The DAC circuit of claim 1, wherein the first current sink is coupled between the reference potential node and a node between two shunt resistive elements in the shunt branch of the resistor ladder circuit.

7. The DAC circuit of claim 1, wherein the first current sink is a short between the shunt branch of the resistor ladder circuit and the reference potential node for the DAC circuit.

8. The DAC circuit of claim 1, wherein the second current sink comprises:
   a first current source;
   a first current mirror having a first branch coupled to the first current source and having a second branch coupled to a common node;
   a second current source;
   a second current mirror having a first branch coupled to the second current source and having a second branch coupled to the common node; and
   a third current mirror having a first branch coupled to the common node and having a second branch coupled to the first output of the DAC circuit.

9. A digital-to-analog converter (DAC) circuit comprising:
   a plurality of current-steering cells;
   a resistor ladder circuit coupled to the plurality of current-steering cells;
   a first current sink coupled between a shunt branch of the resistor ladder circuit and a reference potential node for the DAC circuit; and
   a second current sink coupled between a first output of the DAC circuit and the reference potential node, wherein the second current sink comprises:
      a first current source;
      a first current mirror having a first branch coupled to the first current source and having a second branch coupled to a common node;
      a second current source;
      a second current mirror having a first branch coupled to the second current source and having a second branch coupled to the common node; and
      a third current mirror having a first branch coupled to the common node and having a second branch coupled to the first output of the DAC circuit.

10. The DAC circuit of claim 9, wherein the third current mirror has a gain from the first branch of the third current mirror to the second branch of the third current mirror.

11. The DAC circuit of claim 9, wherein the first current source comprises:
   a reference resistive element;
   a first transistor;
   an amplifier having a first input coupled to a reference voltage source, having a second input coupled to a drain of the first transistor, and having an output coupled to a gate of the first transistor; and
   a second transistor having a gate coupled to the output of the amplifier and having a drain coupled the first branch of the first current mirror.

12. The DAC circuit of claim 11, wherein the reference resistive element is a same resistor type as a plurality of resistive elements in the resistor ladder circuit.

13. The DAC circuit of claim 9, wherein the second current source is calibrated and is independent of process, voltage, and temperature variation.

14. A method of operating a digital-to-analog converter (DAC) circuit comprising a plurality of current-steering cells and a resistor ladder circuit coupled to the plurality of current-steering cells, the method comprising:
sinking a first portion of a common-mode current of the DAC circuit from a shunt branch of the resistor ladder circuit, wherein the first portion of the common-mode current decreases with an increase in a resistance of the resistor ladder circuit; and
sinking a second portion of the common-mode current of the DAC circuit from a first output of the DAC circuit, wherein the second portion of the common-mode current increases with the increase in the resistance of the resistor ladder circuit.

15. The method of claim 14, wherein the second portion of the common-mode current counteracts at least a portion of a variation in the first portion of the common-mode current, due to at least one of a process, voltage, or temperature variation in the DAC circuit.

16. The method of claim 14, further comprising sinking a third portion of the common-mode current of the DAC circuit from a second output of the DAC circuit, wherein the first output and the second output compose a differential output of the DAC circuit.

17. The method of claim 14, wherein sinking the second portion of the common-mode current comprises:
generating a first reference current;
generating a second reference current in a first branch of a first current mirror based on the generating of the first reference current;
mirroring the second reference current in a second branch of the first current mirror;
generating a third reference current in a first branch of a second current mirror;
mirroring the third reference current in a second branch of the second current mirror;
providing a difference current, as a difference between the mirrored third reference current and the mirrored second reference current, to a first branch of a third current mirror; and
mirroring the difference current in a second branch of the third current mirror, wherein the second portion of the common-mode current comprises the mirrored difference current.

18. The method of claim 17, wherein mirroring the difference current comprises mirroring the difference current with a gain from the first branch of the third current mirror to the second branch of the third current mirror.

19. The method of claim 17, wherein the third reference current is calibrated and is independent of process, voltage, and temperature variation.

20. The DAC circuit of claim 8, wherein the third current mirror has a gain from the first branch of the third current mirror to the second branch of the third current mirror.

* * * * *